(12) United States Patent
Svensson

(10) Patent No.: US 8,358,519 B2
(45) Date of Patent: Jan. 22, 2013

(54) SWITCH CONTROL CIRCUIT LIMITING THE MAXIMUM SWITCHING FREQUENCY OF A BRIDGE CIRCUIT WITH A TIMER

(75) Inventor: Kenneth Svensson, Karlshamn (SE)

(73) Assignee: NFO Drives AB, Svangsta (SE)

( * ) Notice: Subject to any disclaimer, the term of this patent is extended or adjusted under 35 U.S.C. 154(b) by 508 days.

(21) Appl. No.: 12/527,516

(22) PCT Filed: Feb. 15, 2008

(86) PCT No.: PCT/SE2008/050186
§ 371 (c)(1),
(2), (4) Date: Aug. 17, 2009

(87) PCT Pub. No.: WO2008/100223
PCT Pub. Date: Aug. 21, 2008

(65) Prior Publication Data
US 2010/0007401 A1    Jan. 14, 2010

(30) Foreign Application Priority Data

Feb. 16, 2007 (SE) ........................... 0700381

(51) Int. Cl.
*H02M 7/5387* (2007.01)
(52) U.S. Cl. .............. 363/56.02; 363/89; 363/56.03
(58) Field of Classification Search ............ 363/55, 363/56.01, 56.02, 79, 95, 97, 98, 131, 132, 363/56.04, 56.03
See application file for complete search history.

(56) References Cited

U.S. PATENT DOCUMENTS

| | | | | |
|---|---|---|---|---|
| 4,729,084 A | * | 3/1988 | Kataoka | ............ 363/56.05 |
| 4,947,309 A | * | 8/1990 | Jonsson | ............ 363/17 |
| 5,536,920 A | | 7/1996 | Kwon | |
| 5,638,260 A | * | 6/1997 | Bees | ............ 363/17 |
| 5,982,106 A | * | 11/1999 | Bobel | ............ 315/209 R |
| 6,166,935 A | * | 12/2000 | Tokashiki et al. | ............ 363/98 |
| 6,940,736 B2 | * | 9/2005 | Jonsson | ............ 363/71 |
| 7,035,118 B2 | * | 4/2006 | Jonsson | ............ 363/17 |
| 2002/0044774 A1 | | 4/2002 | Kawasaki et al. | |
| 2005/0226015 A1 | | 10/2005 | Tsuruya | |
| 2006/0017388 A1 | | 1/2006 | Stevenson | |

FOREIGN PATENT DOCUMENTS

| | | |
|---|---|---|
| EP | 0334886 | 6/1993 |
| WO | WO 02/080342 | 10/2002 |
| WO | WO 02/080343 | 10/2002 |
| WO | WO 03/001656 | 1/2003 |

OTHER PUBLICATIONS

International Search Report for Application No. PCT/SE2008/050186 (Form PCT/ISA/210) dated Apr. 2007.
European Search Report for European Application No. 08 71 2816 mailed Jul. 7, 2011.

* cited by examiner

*Primary Examiner* — Harry Behm
(74) *Attorney, Agent, or Firm* — Capitol City TechLaw

(57) ABSTRACT

A switch control circuit for controlling a bridge circuit comprising: an upper and a lower transistor, connected to a positive and a negative voltage, respectively, and comprising a flywheel diode connected in parallel with each transistor. An LC-circuit filters the voltage from the junction of the transistors. A drive circuit controls each transistor in order to switch off the corresponding switch element when a reference current has been obtained in the inductor and for switching on the corresponding switch element when the current in the inductor is essentially zero. A first timer circuit is arranged for preventing the on-switch of the switch element until a minimum time period has passed.

17 Claims, 7 Drawing Sheets

SWITCH CONTROL CIRCUIT LIMITING THE MAXIMUM SWITCHING FREQUENCY OF A BRIDGE CIRCUIT WITH A TIMER

This application is a National Stage Application of PCT/SE2008/050186, filed 15 Feb. 2008, which claims benefit of Ser. No. 0700381-7, filed 16 Feb. 2007 in Sweden, the entire disclosures of which are incorporated herein by reference. To the extent appropriate, a claim of priority is made to each of the above disclosed applications.

FIELD OF INVENTION

The present invention relates to a safety circuit for a transistor switch circuit. The switch circuit is intended to be used in an inverter for driving a load at varying power and varying frequencies. The switch circuit is a pulse width modulated bridge circuit in which the output is filtered by an inductor and capacitor circuit. The switch circuit operates in all four quadrants, also for so called regenerative power.

BACKGROUND OF THE INVENTION

A self-oscillating transistor switch circuit of this general type is disclosed in EP0334886B1. The bridge switch transistors are controlled by a control circuit so that each switch transistor is switched "off" when certain conditions are met and are switched "on" only when the current in the bridge is very low or essentially zero. Thus, the power dissipation during the switch "on" operation is very low. Further improvements of the basic switch circuit are disclosed in WO02080342A1, WO02080343A1, and WO03001656A1.

The control circuit is constructed so that the switch frequency increases with decreasing load. Thus, the power dissipation in the switch transistors may increase with frequency, which may result in that the power dissipation at low load may be excessively high.

The switch circuit may be provided with transistors of the MOSFET type (metal oxide semiconductor field effect transistor), which can operate at high frequencies up to and above 500 kHz. In certain applications it would be desirable to use bipolar transistors, such as transistors of the IGBT (insulated gate bipolar transistor) type. However, the power dissipation in an IGBT during switch off is larger compared to a MOSFET, partly because of a tail current that may last for several microseconds. Thus, such IGBT cannot be used at high frequencies.

DISCLOSURE OF THE INVENTION

Accordingly, an object of the present invention is to mitigate, alleviate or eliminate one or more of the above-identified deficiencies and disadvantages singly or in any combination.

According to an aspect of the invention, there is provided a switch control circuit for controlling a bridge circuit comprising: an upper and a lower switch element, connected to a positive and a negative voltage, respectively, and comprising a flywheel diode connected in parallel with each switch element, an inductor connected between a junction of the switch elements and a load, and at least one capacitor connected between the load and said voltage, a drive circuit for controlling each switch element in order to switch off the corresponding switch element when a reference current has been obtained in the inductor and for switching on the corresponding switch element when the current in the inductor is essentially zero. A first timer circuit is arranged for preventing the on-switch of the switch element until a minimum time period has passed.

In an embodiment, a current comparator may be arranged for comparing an inductor current with a reference current and for switching off the switch element when the inductor current exceeds the reference current, and a voltage comparator may be arranged for switching on the switch element when the junction voltage exceeds a preset voltage.

In another embodiment, a second timer circuit may be arranged for switching on the switch element after a time-out period. Moreover, a clamping circuit may be arranged for preventing fast oscillations of the voltage comparator after a positive transition of the voltage comparator. The clamping circuit may comprise a third timer blocking negative transitions of the voltage comparator during a predetermined time period, such as 15 µs.

Similar control circuits may be arranged for the upper and the lower switch elements. The switch element may be a transistor of the MOSFET type having an inherent flywheel diode or a transistor of the IGBT type having a flywheel diode connected in parallel therewith.

In another embodiment, the first timer circuit limits the upper operating frequency of the circuit. The minimum time period may be adjustable.

In a further embodiment, the reference current may be adjustable in dependence of the minimum time period. The time-out period may be adjustable and may always be longer than said minimum time period.

BRIEF DESCRIPTION OF THE DRAWINGS

Further objects, features and advantages of the invention will become apparent from the following detailed description of embodiments of the invention with reference to the drawings, in which.

DETAILED DESCRIPTION OF EMBODIMENTS

Below, several embodiments of the invention will be described with references to the drawings. These embodiments are described in illustrating purpose in order to enable a skilled person to carry out the invention and to disclose the best mode. However, such embodiments do not limit the invention. Moreover, other combinations of the different features are possible within the scope of the invention.

Figure 1:
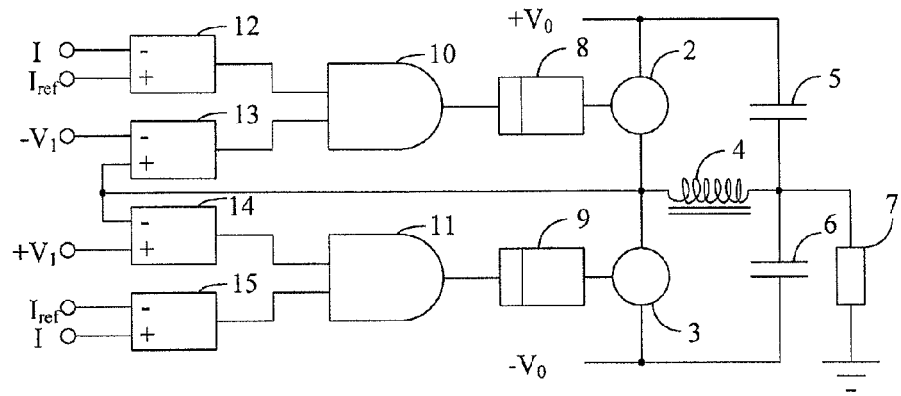
FIG. 1 is a schematic diagram of a switch circuit according to prior art.

A circuit diagram of a switch circuit according to EP0334886B1 is shown in FIG. 1. The switch circuit comprises two transistors 2 and 3 connected in series in a bridge circuit 1 between a positive $+V_0$ and negative $-V_0$ drive voltage. The transistors are shown as MOSFET:s including a flywheel diode. Alternatively, bipolar transistors can be used, such as of the IGBT type, and then a separate flywheel diode is required.

The junction between the two transistors is connected to an inductor 4 and capacitors 5, 6, and further on to a load 7, which may be inductive, capacitive and/or resistive.

The two bridge transistors are controlled by drive circuits 8 and 9 and by a control circuit. In normal operation, only one of the bridge transistors is operated, while the other is essentially idle. For positive current in the inductor, i.e. current directed from the junction between the transistors towards the load 7, the "upper" transistor 2 connected to the positive rail terminal $+V_0$ is operated and for negative current, the "lower" transistor 3 is operated.

The control circuit comprises a current comparator 12, which compares a current I in the inductor 4 with a reference current $I_{ref}$. If the inductor current I exceeds the reference current, the current comparator outputs a logical "zero", which switches the transistor "off" via an AND-gate 10 and the drive circuit 8.

The control circuit also comprises a voltage comparator 13, which compares the voltage E at the junction between the transistors with a preset voltage $-V_1$, which is negative for the upper transistor and positive for the lower transistor. If the junction voltage E is below the preset voltage $-V_1$, the voltage comparator outputs a logical "zero" and the upper transistor is prevented from being turned "on", via the AND-gate 10.

There is a "lower" voltage comparator 14 which compares the junction voltage E with the positive preset voltage $+V_1$ and outputs a logical "zero" if the junction voltage is above the preset voltage, thereby preventing the lower transistor from being switched "on".

Figure 2:
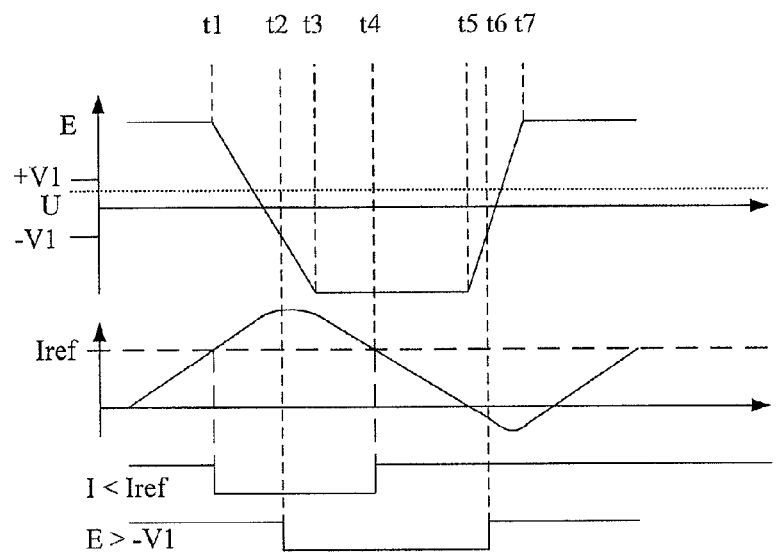
FIG. 2 is a schematic time diagram of the different circuit components as shown in FIG. 1.

The operation of the circuit is explained with reference to the time diagram of FIG. 2.

When the upper transistor just has been switched "off", at time instance $t_1$, as described above by means of the current comparator 12, the junction voltage E decreases towards the negative rail $-V_0$ resulting in that the inductor current I starts to decrease. The inductor current now passes through the flywheel diode of the lower transistor. However, the inductor current cannot be reversed immediately, but is slowly changing and makes on "overshot" between times $t_1$ and $t_3$ as shown in FIG. 2.

When the junction voltage E has decreased below the preset voltage $-V_1$, at time instance $t_2$, the voltage comparator 13 outputs a logical "zero", which locks the AND-gate 10 and prevents the upper transistor from being switched on.

When the inductor current I has decreased below the reference current $I_{ref}$, at time instance $t_4$, the current comparator outputs a logical "one", but the upper transistor is still prevented from being switched "on" by the voltage comparator.

When the inductor current I has decreased to zero, at time instance $t_5$ the inductor current cannot be changed immediately, but becomes negative and makes an "undershot" between times $t_5$ and $t_7$, whereby the negative current has to pass through the flywheel diode of the upper transistor. This results in that the junction voltage E increases towards the positive rail $+V_0$.

When the junction voltage E has increased above the preset voltage $-V_1$, the voltage comparator outputs a logical "one", at time instance $t_6$, resulting in that the upper transistor is switched "on", since the current comparator outputs a logical "one". The on-switch takes place during the time the flywheel diode is conducting, so that voltage over the transistor is low and the current is also almost zero. Now, the inductor current I increases towards the reference current $I_{ref}$ and the cycle is repeated.

The same operation takes place with the lower transistor, but an inverted current signal is used obtained by a lower current comparator 15 and the lower voltage comparator 14 compares the junction voltage E with a preset voltage $+V_1$. The signals are combined by an AND-gate 11, which drives the drive circuit 9. The lower comparator 15 may be an inverter providing the inverse of the upper comparator.

It is noted that the lower transistor actually is switched on for a short while just after the time instance when the upper transistor has been switched off. This takes place during the time the lower flywheel diode is conducting and does no harm to the operation.

Since the switch "on" of the transistor(-s) takes place at zero current, the power dissipation during the on-switch is small. However, the current dissipation during the off-switch takes place at a maximum current, resulting in a substantial power dissipation. The total result is a decrease of power dissipation compared to previously known bridge circuits.

The load 7 should be driven at a desired voltage $U_0$ and current $I_0$ that is depending on some conditions. The control circuit could be adapted to control the bridge transistors either in dependence of the desired voltage $U_0$ or the desired current $I_0$.

It is noted that the inductor current I is essentially triangular and the mean current thereof results in the desired current $I_0$. The mean current of a triangular current is half of the top current. Thus, $I_{ref}$ could be set to the double of the desired current $I_0$.

If the control circuit should be controlled by the desired voltage $U_0$, a control reference current $I_{ref}$ could be generated by integrating the difference between the actual voltage U and a desired voltage $U_{ref}$.

The inductor current I can be estimated by measuring the potential (E-U) over the inductor and integrating the potential.

Another method of estimating the inductor current I would be to include a measurement winding on the inductor, for example one revolution, and integrating the measured voltage. As described in WO02080343A1, the output voltage of the measurement winding may be filtered by an RC-circuit, resulting in an output, which is essentially the inductor current, however, without a DC-component.

During start-up of the bridge circuit, the load voltage U is close to zero. Since both transistors initially are turned off, the junction voltage E is also close to zero. The inductor current I is also close to zero. Both voltage comparators 13, 14 initially have the logical value "one". The current comparator may have any value. If the upper comparator 12 is "zero", the lower transistor will be turned on, and if the comparator is "one" the upper transistor will be turned on. Now, the reference current $I_{ref}$ and the junction voltage E becomes well defined and the operation will adjust itself to the conditions set.

During some conditions, such as low load, the energy in the inductor may be insufficient for returning the junction voltage E to the first rail $+V_0$ at time instance $t_7$, whereby a ringing may occur, as described in WO02080342A1. Such ringing may be counteracted by including a JK-flip-flop that is set by the first rising edge of the voltage comparator.

During other conditions, for example at a load with high impedance, the reference current may be set outside the operating range, so that the inductor current I never reaches the reference current $I_{ref}$. Please note that the reference current $I_{ref}$ is double as high as the desired current $I_0$. Then, the bridge circuit will lock to the positive rail, and the oscillations will cease. Such a condition can be remedied by adding a time-out circuit as described in EP0334886B1, which switches off the transistor after a predetermined time period.

If transistors of the type IGBT is used, there are restrictions on the switch frequency of the switch circuit. The frequency cannot be too high, since the power dissipation will then be too high, resulting in overheating of the transistors. The frequency cannot be too low, since then the distortion of the output voltage may be excessive. An operating frequency area can be between 5 to 40 kHz or even smaller, such as between 10 to 20 kHz. This results in severe limitations on the operation both at low currents, when the switch frequency becomes high, and at high loads, when the switch frequency becomes low. This problem has been dealt with in WO03001656A1 by parallel connection of several bridge circuits. At low loads, only one bridge circuit is used. However, even a single bridge circuit cannot be operated down to zero load.

The present embodiment solves this problem in another manner and provides a bridge circuit that can be operated down to zero load.

It is observed that most of the power dissipation is due to the off-switch of the power transistors. The construction of the circuit results in a self-oscillation at a frequency, which is inversely proportional to the load.

Thus, according to the present embodiments, the power dissipation may be reduced by delaying the on-switch of the power transistor.

According to an embodiment, this is done by stopping the self-oscillations and restarting a new cycle after a minimum time period. This effectively reduces the maximum frequency without limiting the controllability of the circuit. If the self-oscillation time period is smaller than the minimum time period, the oscillations are terminated and the circuit is restarted after expiration of the minimum time period. As will be explained below, the restarting of a new cycle takes place at zero current resulting in minimal power dissipation.

The minimum time period may be fixed or adjustable. If the minimum time period is adjustable, it can be controlled by the load, for example by the output current. The minimum time period may be controlled between a first time period, such as 50 µs, and a second time period, such as 150 µs.

When the load is above a first value, the time period may be the first time period and when the load is below a second value, the time period may be the second time period.

The minimum time period can be controlled by the temperature of the switch transistors. The minimum time period could be proportional to the temperature, thus allowing a high switch frequency at low temperature and a lower switch frequency at high temperature.

Figure 3:
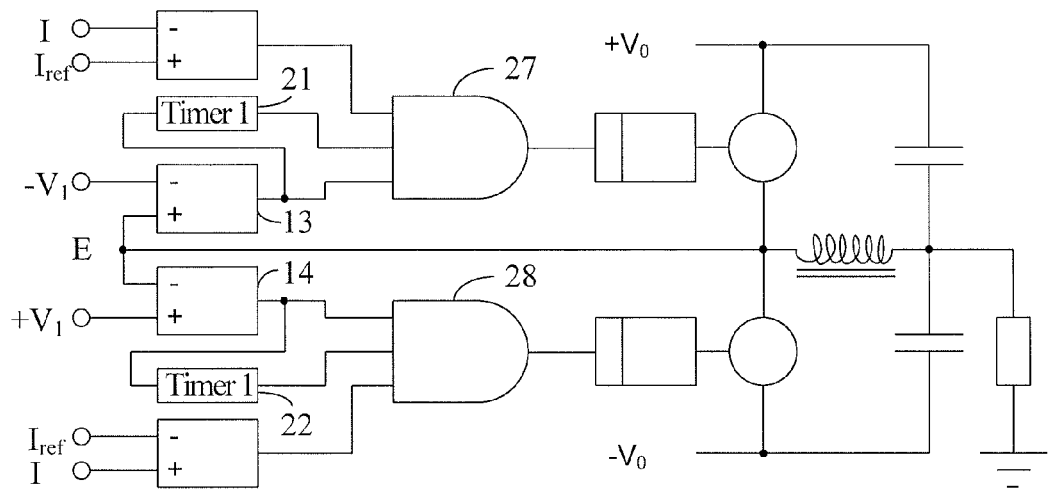
FIG. 3 is a schematic diagram of a switch circuit according to a first embodiment of the invention.
Figure 4:
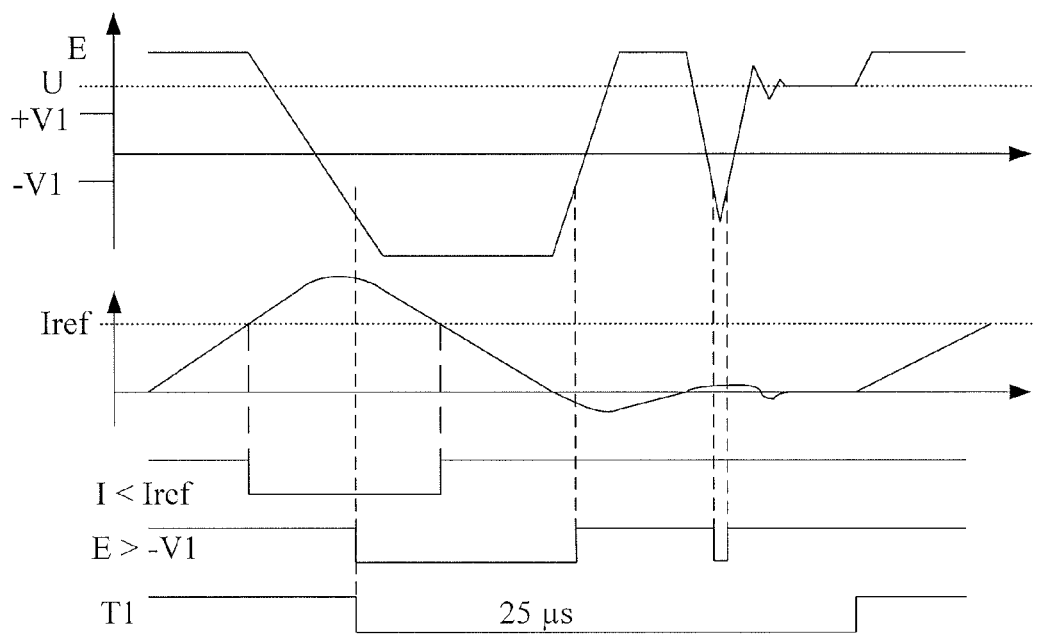
FIG. 4 is a schematic time diagram of the different circuit components as shown in FIG. 3.

An embodiment including the feature of a minimum time period is shown in FIG. 3. A one-shot timer circuit 21, 22 (Timer 1) is included and connected to the output of the voltage comparator 13, 14. When the voltage comparator goes low, outputting a logical "zero", the timer circuit is initiated, triggered or fired and outputs a logical "zero" during a time interval, such as 25 or 50 µs, independently of any change at the input of the timer. If the voltage comparator goes high within this minimum time period, the timer will prevent the upper transistor from being turned on, so that the self-oscillation is terminated. The junction voltage will approach the output voltage U and the inductor current will oscillate around approximately zero. When the timer circuit returns to logical "one" after the time interval, the upper transistor is turned on again and a new cycle is started, by an AND-gate 27, 28 having three inputs.

The cycle terminated and restarted by the timer may be followed by several such cycles. However, the control circuit will tend to increase the reference current $I_{ref}$ since the voltage U will drop below a voltage $U_{ref}$. This may result in that one or several normal periods follow the timer controlled period(-s). However, because of the reduced switch frequency, the total power dissipation in the switch transistors will be lower, as further explained below.

Figure 5:
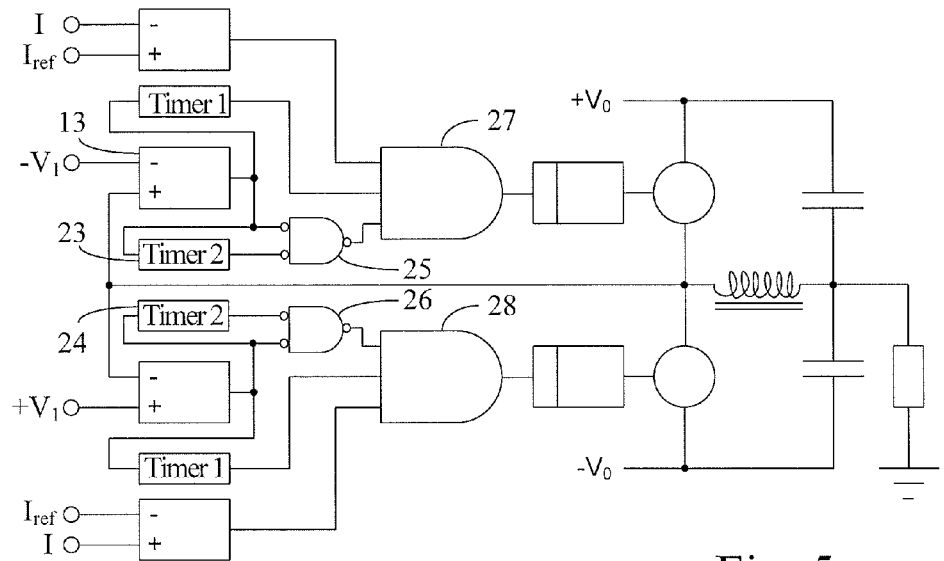
FIG. 5 is a schematic diagram of a switch circuit according to a second embodiment of the invention.

During most conditions, the timer is restarted without any problems. However, at certain conditions, the voltage U is below the preset negative voltage $-V_1$ while a positive current should be generated, such as at an inductive load wherein the voltage is 90 degrees in advance of the current. In this case, the junction voltage E is outside the starting window between the voltages $+V_1$ and $-V_1$, resulting in that the circuit may not start. In this case, a further timer circuit 23, 24 (Timer 2) may be arranged to restart the bridge circuit after a timeout period by overriding the blocking signal from the voltage comparator 13, 14. The timeout time period may be large, such as 500 µs or more and should be larger than the minimum time period of the first timer 21. This situation is shown in FIGS. 5 and 6.

A second timer circuit 23 is triggered by the falling edge of the voltage comparator 13, whereby the timer circuit outputs a logical "zero". The timer is always reset by a rising edge of the voltage comparator 13.

The output of the voltage comparator 13 and the output of the second timer circuit 23 are fed to input terminals of inverting inputs of an NAND-gate 25, 26, the output of which is connected to the AND-gate 27, 28. If the voltage comparator 13 returns to "one" before the time out of the timer circuit, the timer circuit is reset to "one". The NAND-gate with inverting inputs operates like an OR-gate.

Figure 6:
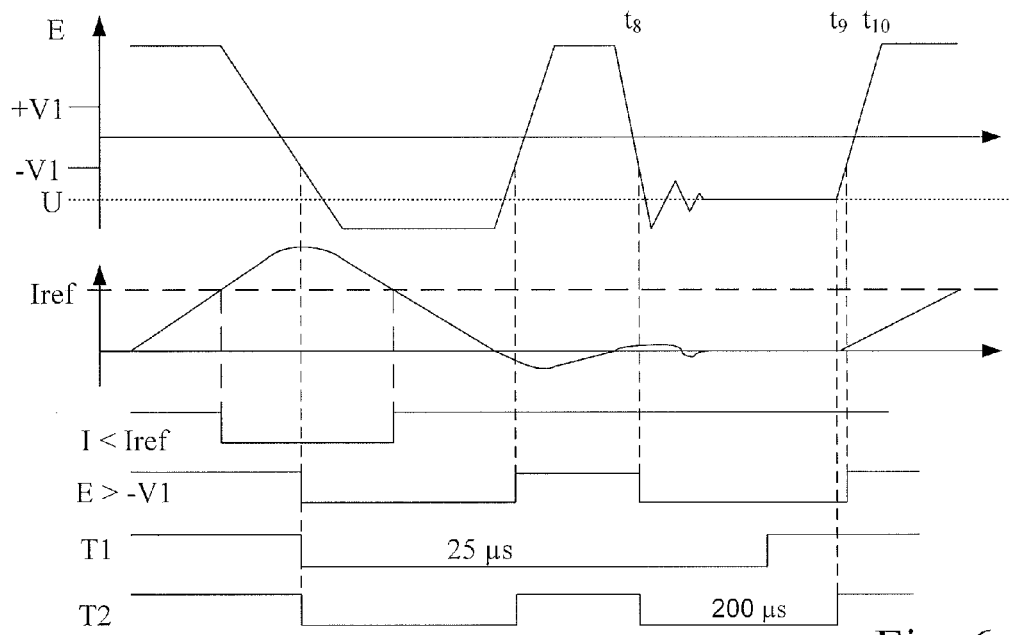
FIG. 6 is a schematic time diagram of the different circuit components as shown in FIG. 5.

If the desired voltage U is negative and below the reference voltage $-V_1$, and at the same time a positive current $I_{ref}$ should be provided, and the first timer has terminated the self-oscillations and the circuit should be restarted, the conditions of the current comparator and the voltage comparator may be as shown in FIG. 6. Thus, the positive edge at time instance between $t_8$ and t9 of the first timer 21 (T1) will not restart the circuit, because the voltage comparator 13 outputs a logical "zero". However, after a time-out period (such as T2, 200 µs), the second timer 24 will time-out and revert to its "one" position. Thereby, the output of the NAND-gate 25 will change from a logical "zero" to a logical "one" at time instance $t_9$ and switch on the transistor. The voltage comparator will change to "one" shortly thereafter, at time instance $t_{10}$.

The time-out timer T2 is only used if the switch circuit is locked, which takes place relatively rarely. Thus, the time-out time period can be set to any desired value, such as 500 µs or longer. The time-out period should always be longer than the minimum time period, so that Timer 2 only is used when the Timer 1 time period has elapsed. The Timer 2 time period can be adjustable in dependence of the Timer 1 time period.

Figure 7:
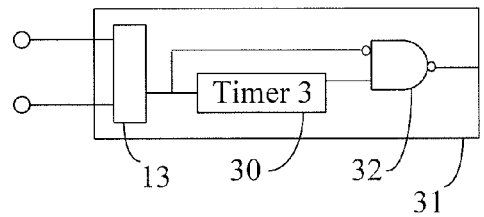
FIG. 7 is a schematic diagram of a switch circuit according to a third embodiment of the invention.

A third timer may be used for preventing oscillations in the voltage comparator output, as shown in FIG. 7. The third timer 30 is triggered by a positive transition of the voltage comparator 13 and outputs a logical "zero" for a preset short time period of e.g. 15 μs. During this time period, the output of the modified voltage comparator 31 is maintained at "one" even if the voltage comparator 13 changes its condition. The output of the timer 30 is connected to a NAND-gate 32 with a non-inverting input. A second inverting input is connected to the output of the voltage comparator 13. The original voltage comparator 13, the timer 30 and the NAND-gate 32 together form the modified voltage comparator 31, and may replace the output from the original voltage comparator 13 in any of the previous circuits.

Figure 8:
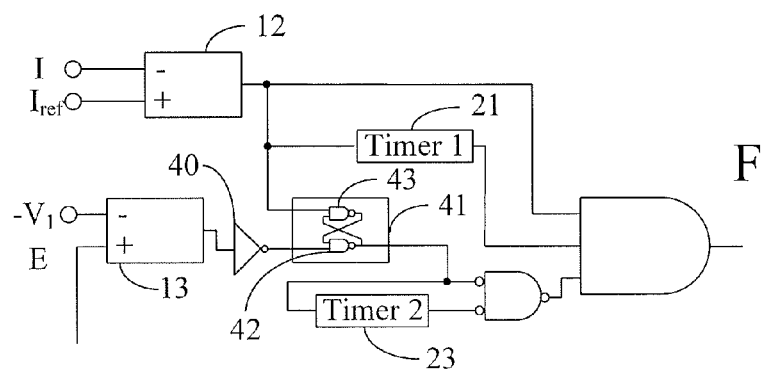
FIG. 8 is a schematic diagram of a switch circuit according to a fourth embodiment of the invention.

A similar operation of suppressing spurious oscillations during the on-switch may be obtained by the use of a multivibrator or flip-flop as shown in the circuit diagram of FIG. 8. The output of the voltage comparator 13 is inverted by inverter 40 and connected to an input of a JK flip-flop 41. The other input of the flip-flop 41 is connected to the output of the current comparator 12. The output of the flip-flop 41 is connected to for example NAND-gate 26 in FIG. 5 and/or replaces the output signal of the voltage comparator 13 in any of the circuits described above. The flip-flop 41 has a first NAND-gate 42 having a first input, which is connected to the output of the voltage comparator, i.e. the lowest input in FIG. 8. The second input of the NAND-gate 42 is connected to the output of a second NAND-gate 43, the first input of which being connected to the current comparator 12 and the second input of which being connected to the output of the NAND-gate 42.

The operation is as follows. During conduction of the transistor before time period $t_1$, the output of flip-flop 41 is "one". The output of current comparator 12 is also "one", resulting in that the output of the second NAND-gate 43 is "zero". The output "zero" is connected to the second input of the first NAND-gate 42, thereby blocking the second NAND-gate 42. Thus, the output of the second NAND-gate 42 is "one" independently of the first input from the voltage comparator.

When the current comparator 12 goes low at time instance $t_1$, the first input of the second NAND-gate 43 becomes "zero", resulting in that the output of the second NAND-gate 43 becomes "one", which is fed to the second input of the first NAND-gate 42. The first NAND-gate is now "opened" and may respond to any action of the first input from the voltage comparator 13. When the voltage comparator goes low at time instance $t_2$, the output of the inverter 40 becomes "one", which is input to the first input of the first NAND-gate 42, the output of which goes low to "zero". Thus, the multivibrator output goes low at the same time as the voltage comparator 13.

Now, the second input of the second NAND-gate 43 becomes "zero", thereby blocking the second NAND-gate 43 so that its output is maintained at "one" irrespective of the state of the first input of the second NAND-gate 43 connected to the current comparator 12. Thus, when the current comparator 12 goes high at time instance $t_4$, nothing happens in the flip-flop 41.

When the voltage comparator goes high at time instance $t_6$, the output of inverter 40 becomes "zero", resulting in that the first NAND-gate 42 changes its output to "one". Thus, the multivibrator 41 output goes high at the same time as the voltage comparator 13.

Figure 9:
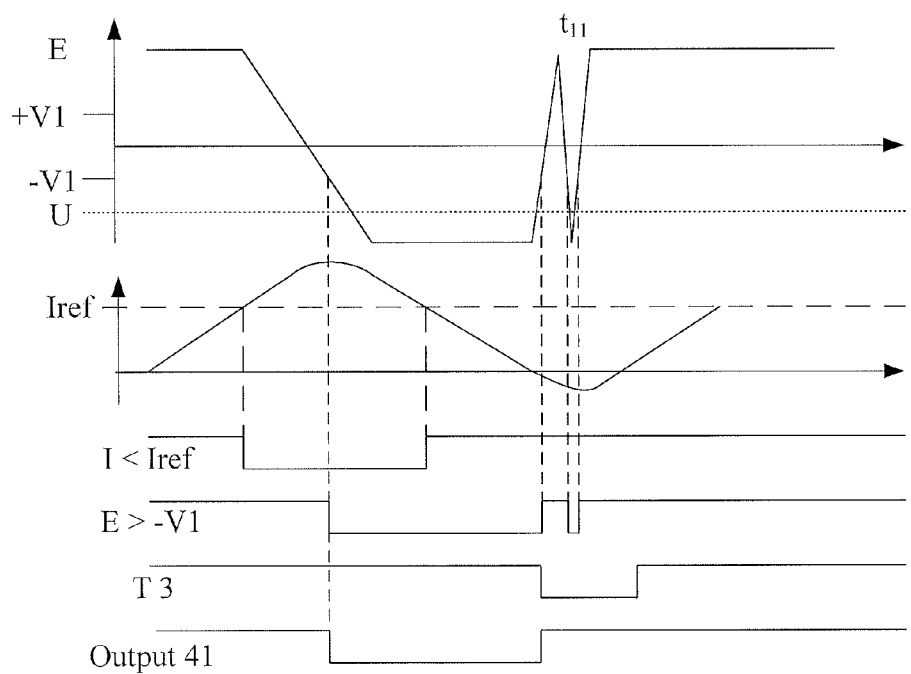
FIG. 9 is a schematic time diagram of the different circuit components as shown in FIGS. 7 and 8.

The "one" output of the first NAND-gate 42 and the "one" output of the current comparator 12 result in that the second NAND-gate 43 changes its condition and the output thereof goes to "zero", thereby again locking the first NAND-gate 42. Thus, the first NAND-gate 42 will not react on oscillations in the output of voltage comparator as shown at time instances $t_{11}$, see FIG. 9. Thus, the multivibrator output stays high when the voltage comparator 13 oscillates as shown at time instance $t_{11}$, for example during the on-switch of the transistor. Such oscillations can also occur if the oscillations shown just to the right of $t_8$, see FIG. 6, occur at a junction voltage E close to the preset voltage $-V_1$.

The multivibrator is triggered again when the current comparator goes low and the cycle is repeated.

Such a multivibrator 41 also takes care of the situation shown in FIG. 6. Thus, the multivibrator 41 will remain at "one" also when the voltage comparator goes to "zero" at $t_8$, and the circuit can restart when the first timer (T1) 21 times out after 25 μs, see FIG. 6.

In FIG. 8, the first timer 21 is shown to be triggered by the current comparator 12 instead of the voltage comparator. The second timer 23 may as well be triggered by the current comparator 12.

Figure 11:
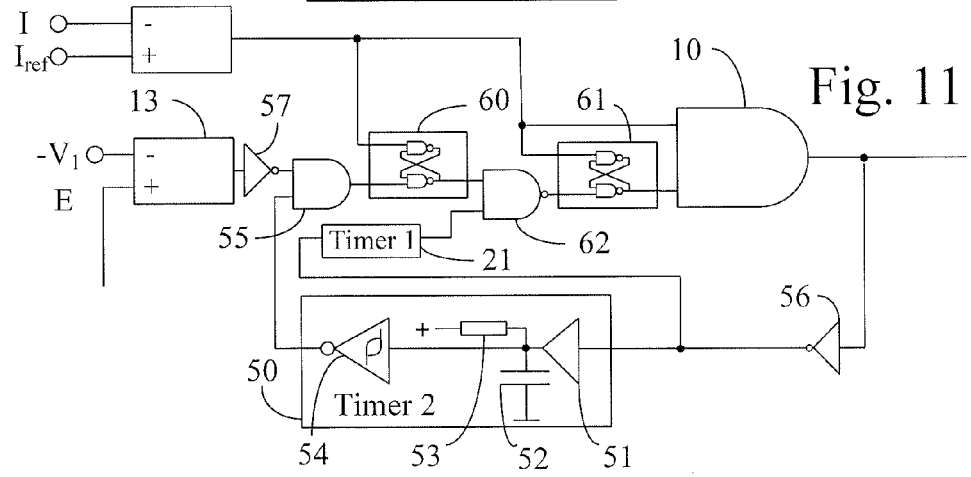
FIG. 11 is a schematic diagram of a switch circuit according to a sixth embodiment of the invention.

FIG. 11 shows an embodiment of the second timer (Timer 2). The second timer 50 is shown to include a buffer 51 of the open collector type, the input of which being connected to an inverter 56 connected to the output of the AND-gate 10 of FIG. 1 or the AND-gate 27 of FIG. 3, 5 or 8. Thus, the inverter 56 output goes low when the on-switch signal is sent to the transistor at time $t_0$, see FIG. 12. This results in that a capacitor 52 is short-circuited to the ground. Then, an output of a threshold voltage comparator 54 becomes "one". The output of comparator 54 is connected to a first input of an AND-gate 55, the second input of which is connected to the voltage comparator 13 via an inverter 57. Thus, the AND-gate 55 is "open" and assumes the state of the output of the inverter 57.

When the transistor is switched off at time instance $t_1$, the second timer 50 is triggered by the fact that the output of the inverter 56 becomes "one". Then, the buffer obtains a high impedance state, since the open collector is blocked. The capacitor 52 is now charged by a resistor 53 and the voltage over the capacitor increases. When the voltage after a second time period of for example 500 μs, exceeds a threshold voltage of comparator 54, the threshold comparator changes to "zero". This effectively blocks the AND-gate so that its output is always "zero" independently of the output of the voltage comparator. This forces the circuit to switch on the transistor and a new cycle is started. When the transistor is switched on, the inverter 56 output becomes "zero", which closes the buffer 51 and the capacitor is discharged during a time period, which is dependent on the resistance of the collector of the buffer 51. It is only required that this time period is short, so that the triggering signal does not occur before the capacitor is discharged.

The further operation should become evident from the description of the other circuits above.

Figure 10:
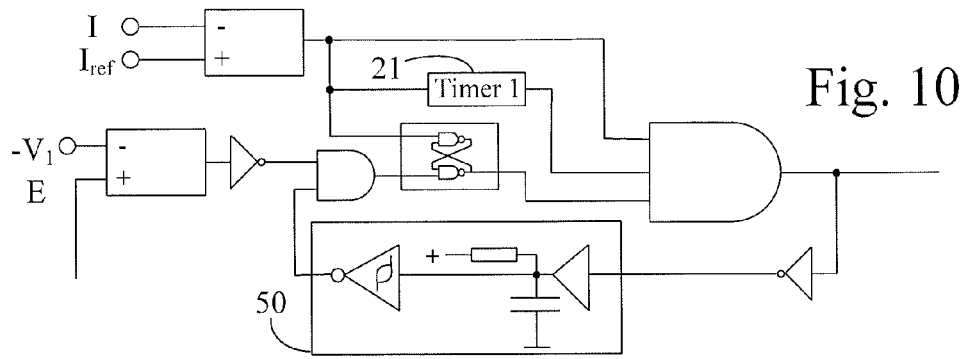
FIG. 10 is a schematic diagram of a switch circuit according to a fifth embodiment of the invention.

FIG. 10 shows that the first timer circuit 21 may be triggered by the current comparator while the second timer circuit 50 is triggered by the off-switch of the power transistor. As shown in FIG. 11, the first timer circuit may alternatively be triggered by the on-switch of the power transistor, as shown in the timing diagram of FIG. 12. If the first timer circuit is triggered by the on-switch and also activates the on-switch, i.e. the minimum time period is used as an on-switch signal, the first timer is triggered almost simultaneously as the timing period expires. This is possible in a 555-circuit, see further below. Moreover, there is a certain delay in the circuits giving time for the charging capacitor to discharge.

Figure 12:
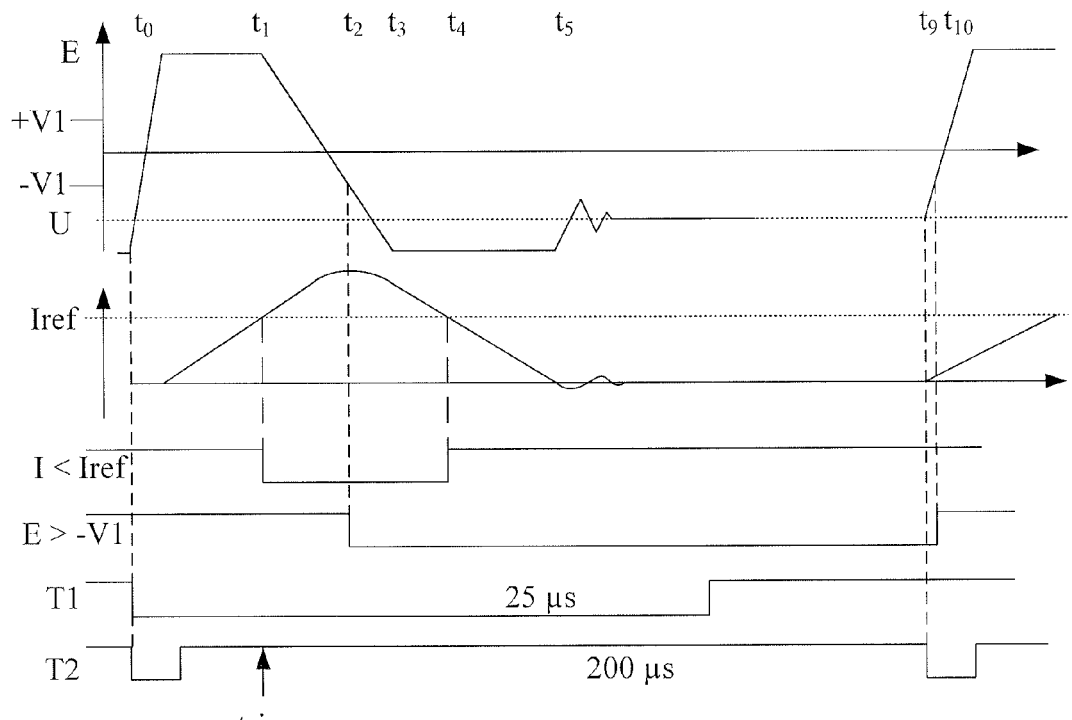
FIG. 12 is a schematic time diagram of the different circuit components as shown in FIGS. 10 and 11.

FIG. 12 shows a situation, in which the self-oscillations of the bridge circuit ceases, if the second timer is not included. Suppose that $I_{ref}$ is positive and U is negative substantially below the preset voltage $-V_1$. In this situation, the slope of the current I is low during the time period $t_3$ to $t_5$, when the transistor is switched off. The slope is proportional to $(-V_0-U)$, which is small. Then, the energy in the inductor will not be sufficient for reversing the junction voltage E at time instance $t_5$, and the junction voltage will remain below $-V_1$. In this situation, the voltage comparator 13 will stay at "zero" and the multivibrator 41 will not remedy this situation. However, as shown at time instance $t_9$, the second timer will restart the circuit.

The second timer 50 may alternatively be triggered by the current comparator or the voltage comparator. The timer is triggered by a positive transition, so the triggering signal may be required to be inverted.

The timers mentioned above are active only after the off-switch of the transistor, and thus do not control the on-switch timings.

In FIG. 11, it is shown that the first timer 21 is triggered by the on-switch of the transistor. This on-switch is first inverted by inverter 56 and a negative transition triggers the first timer 21, at time instance $t_0$. The first timer 21 blocks an NAND-gate 62, which results in that the voltage comparator cannot start the circuit until the minimum time period has lapsed. A further multivibrator 61 is arranged. This multivibrator ensures that the transistor is not turned off when the timer 21 is retriggered.

By this construction, the minimum total cycle time, including the on-switch time period, is controlled to be at least equal to the minimum time period set by the first timer 21. It is noted that the second timer can also be constructed in the same way, thus controlling the total cycle time, including the on-switch time period.

Figure 15:
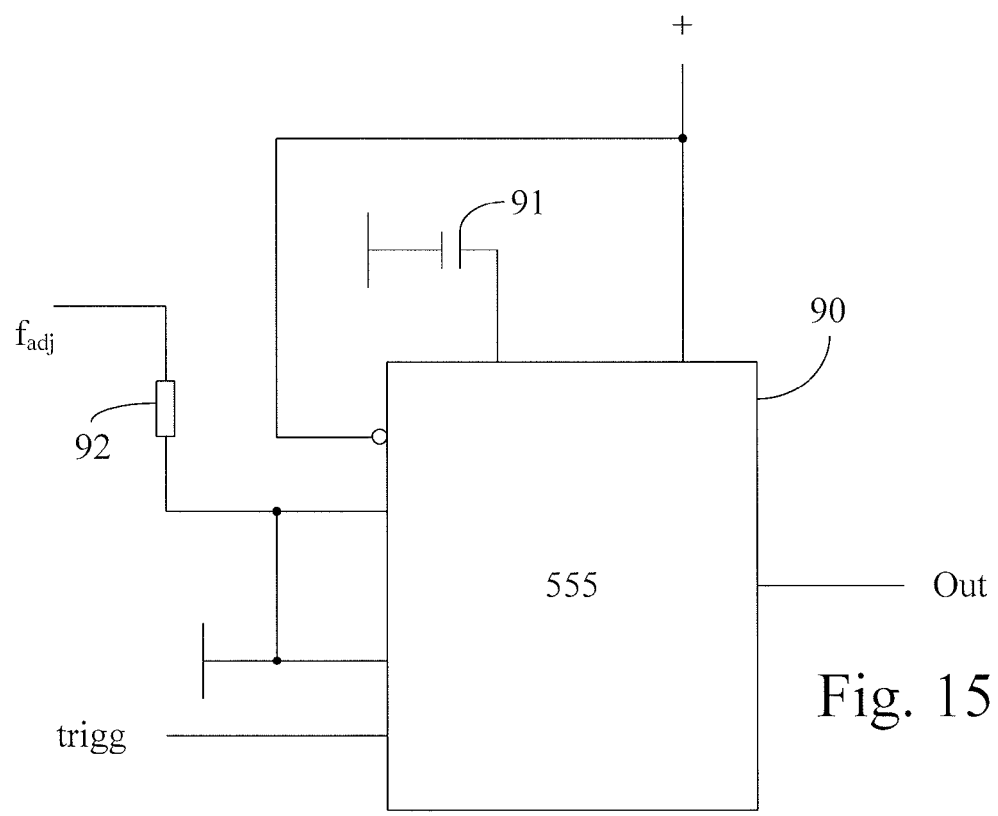
FIG. 15 is a schematic diagram of a timer circuit, which may be used in any of the above embodiments.

The timers may be embodied around a 555 circuit of conventional construction. Such a timer circuit is shown in FIG. 15. The 555 circuit 90 comprises an input for connection of a timing capacitor 91 and an input for connection of a charging resistor 92. The charging resistor is connected to a frequency adjust input, which may be taken from the circuit shown in FIG. 13, see below. Alternatively, the frequency adjust input can be obtained or generated from a processor as a function of the current $I_0$. Alternatively, the frequency adjust input can be obtained from one or several thermistors physically arranged adjacent to the power transistors for sensing the temperature of the transistors. A triggering signal is provided to the triggering input line of the 555 circuit, which starts a timing period determined by the capacitor 91, the resistor 92 and the frequency adjust signal. The triggering signal can be taken from the current comparator, the voltage comparator, the off-switch signal or the on-switch signal to the transistor. The circuit is a standard circuit for this type of 555 timer circuit and is not further described here.

The timer period of the first and/or the second timer can be adjustable. The timer may be embodied as a counter, which is preset with a figure, for example the number of microseconds, and which is counted down to zero at triggering by a clock-signal, which can have a cycle of for example 1 µs. In this way, the timer is adjustable by changing the preset figure.

The different operations of the circuitry can be embodied in a processor, such as a signal processor, or in a programmable logic such as an ASIC or FPGA. In this case, it is easy to set the time period of each timer as desired.

Figure 14:
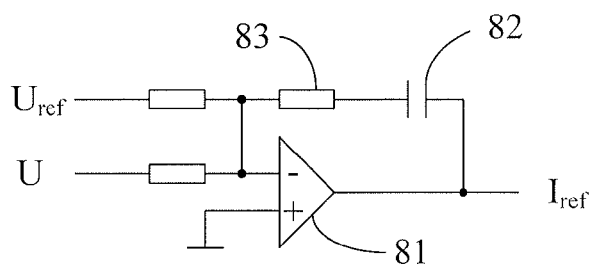
FIG. 14 is a schematic diagram of a circuit for providing a reference current signal.

The control signal Iref can be obtained by integrating the difference between the actual voltage over the load U and a reference voltage Uref as shown in FIG. 14. This is the same as disclosed in EP00334886-B1 mentioned above, and is not further described here.

Figure 13:
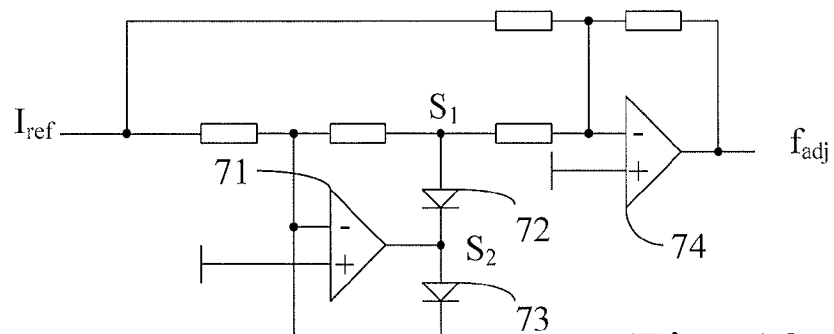
FIG. 13 is a schematic diagram of a circuit for providing a frequency control signal.

A control signal for controlling the time period of the first timer may be obtained from the signal $I_{ref}$. The signal $I_{ref}$ is precision rectified by a first OP-amplifier and the rectified signal is buffered by a second OP-amplifier. The output of the second amplifier controls the minimum time period so that at high voltage, a switch frequency of 25 to 50 kHz is obtained and a low voltage a switch frequency of 7 to 12 kHz. The precision rectifier circuit is shown in FIG. 13 and comprises a first OP amplifier 71, connected to two diodes 72, 73 forming a half-wave rectifying circuit. A second OP amplifier 74 has an amplification of two and add the other half-wave to the output $S_1$ of the first OP amplifier 71, thereby effectively obtaining a full-wave rectified output signal. The circuit is a standard circuit described in the literature. The output signal from the circuit can be used as a frequency adjust signal and connected to the frequency adjust connection of the circuit in FIG. 15.

In a bridge circuit, it is always of interest to minimize the power dissipation. As is observed, the power dissipation decreases if the switch frequency is decreased. This can be used for minimizing the power dissipation and thus increasing the efficiency of the inverter. This is of special interest for IGBT transistors, in which the switch losses are much larger than the conduction losses during the on-time of the transistors.

Suppose that the bridge circuit would operate in the normal mode at 10 kHz for supplying a desired current of $I_0$. The reference current $I_{ref}$ would then be $2*I_0$. Suppose that the voltages are such that the bridge circuit is able to deliver $2*I_{ref}$. In this case, it would be possible to drive the bridge circuit at 2.5 kHz by adjusting the minimum time period to be 400 µs (the entire cycle) and adjusting the reference current to be the double of the previous reference current. The same average current $I_0$ would be obtained in the two cases.

This would save energy, since the switch frequency has been reduced by the square of the increase of the maximum current, whereby the switch power losses will be much smaller and the conduction losses will only increase to a smaller extent.

This feature can be used for generating an optimal minimal time period for different load conditions. The bridge circuit is driven so that the Timer 1 controls the operation during most conditions. If the Timer 1 is not adjusted properly, the self-oscillation operation takes over.

One method of operating the switch circuit is to set a high reference current Iref, and then allow the switch circuit to perform one cycle. The integral of the current over the cycle is calculated, and from that, the minimum time period for timer 1 is calculated so that the desired current $I_0$ is obtained. This minimum time period is then used in the next cycle. The calculation can include a determination of the cycle period and if the cycle period is larger than a predetermined value (the minimum switch frequency of for example 5 kHz should not be violated), the $I_{ref}$ is reduced in the next cycle. In this way, $I_{ref}$ and the period time of the first timer are adapted to the conditions prevailing. If a large current is required, a low frequency is obtained as before. If a medium current is required, the frequency is controlled by the first timer. If a small current is required, the $I_{ref}$ is also reduced.

Figure 16:
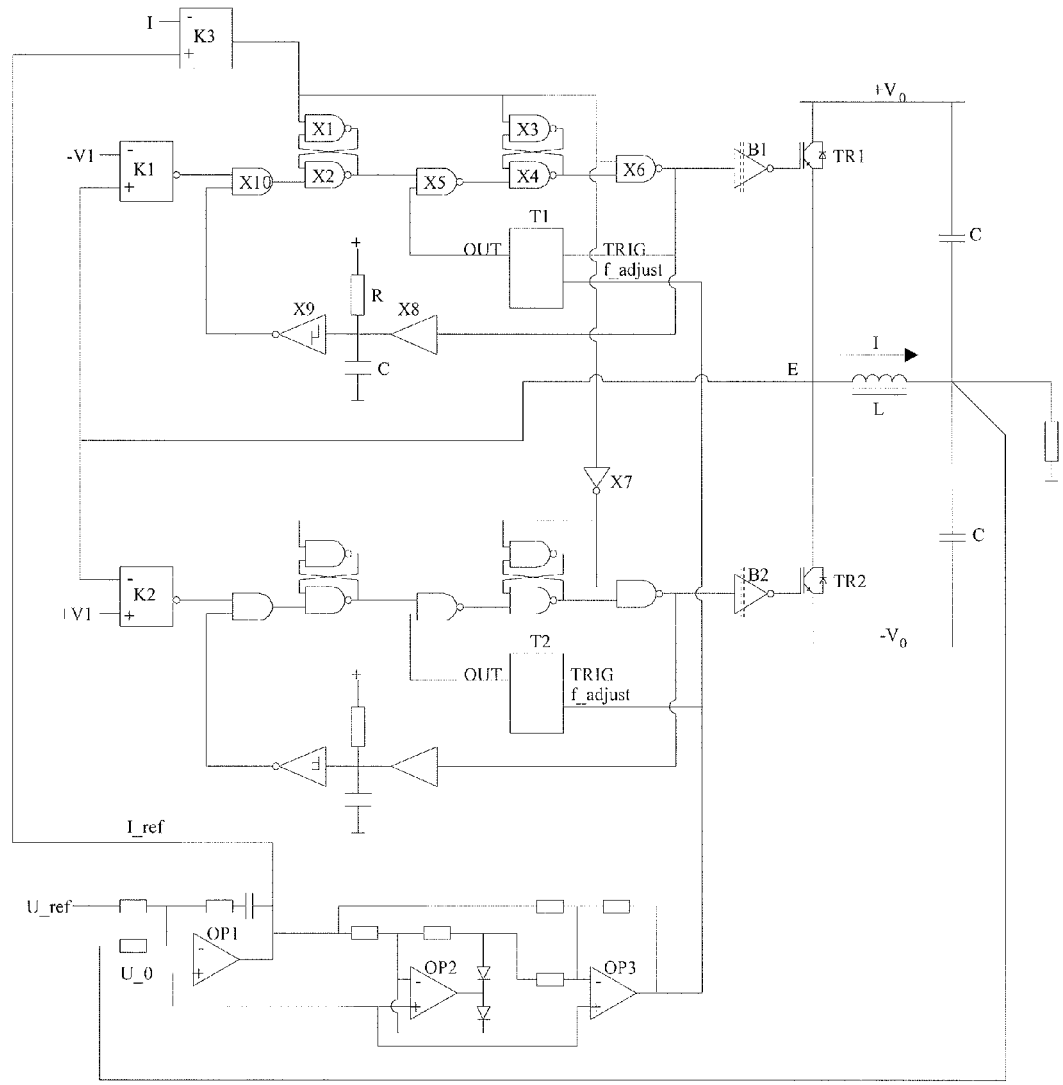
FIG. 16 is a schematic diagram of a prototype embodiment of the invention.

FIG. 16 shows a complete prototype embodiment of the switch circuit. There are some details differing from the circuits described above. Otherwise, the operation is substantially as explained above.

The differences are for example that the drive circuit B1, B2 is of the inverting type, which means that also the gate X6 driving the drive circuit is of the inverting type. The lower current comparator is replaced by an inverter X7, which inverts the signal from the upper comparator K3.

In the claims, the term "comprises/comprising" does not exclude the presence of other elements or steps. Furthermore, although individually listed, a plurality of means, elements or method steps may be implemented. Additionally, although individual features may be included in different claims, the individual features may be combined separately in other combinations, and the inclusion of the features in different claims does not imply that another combination of features is not feasible and/or advantageous. In addition, singular references do not exclude a plurality. The terms "a", "an", "first", "second" etc do not preclude a plurality. Reference signs in the claims are provided merely as a clarifying example and shall not be construed as limiting the scope of the claims in any way.

Although the present invention has been described above with reference to specific embodiment, it is not intended to be limited to the specific form set forth herein. Rather, the invention is limited only by the accompanying claims and other embodiments than those described above are equally possible within the scope of the appended claims.

The invention claimed is:

1. A switch control circuit for controlling a bridge circuit comprising:
    an upper and a lower switch element, connected to a positive and a negative voltage, respectively, and comprising a flywheel diode connected in parallel with each switch element,
    an inductor connected between a junction of the switch elements and a load, and at least one capacitor connected between the load and any of said voltages,
    a drive circuit for controlling each switch element in order to switch off the corresponding switch element when a reference current has been obtained in the inductor and for switching on the corresponding switch element when the current in the inductor is essentially zero,
    a first timer circuit adapted to prevent the on-switch of one of the switch elements until a minimum time period has passed such that the maximum switching frequency of the bridge circuit is limited, wherein the first timer circuit is adapted to prevent the on-switch of said one of the switch elements until the minimum time period has passed from the previous on-switch of said one of the switch elements,
    a current comparator for comparing an inductor current with the reference current and for switching off said one of the switch elements when the inductor current exceeds the reference current, and
    a voltage comparator for switching on said one of the switch elements when the junction voltage exceeds a preset voltage.

2. The circuit according to claim 1, further comprising a clamping circuit for preventing fast oscillations of the voltage comparator after a positive transition of the voltage comparator.

3. The circuit according to claim 2, wherein the clamping circuit comprises a third timer blocking negative transitions of the voltage comparator during a predetermined time period, such as 15 µs.

4. The circuit according to claim 1, wherein at least one additional control circuit is arranged for the upper and the lower switch elements and wherein said switch element is a transistor of the MOSFET type having an inherent flywheel diode or a transistor of the IGBT type having a flywheel diode connected in parallel therewith.

5. The circuit according to claim 1, wherein said minimum time period is adjustable.

6. The circuit according to claim 1, wherein said reference current is adjustable in dependence of the minimum time period.

7. A switch control circuit for controlling a bridge circuit comprising:
    an upper and a lower switch element, connected to a positive and a negative voltage, respectively, and comprising a flywheel diode connected in parallel with each switch element,
    an inductor connected between a junction of the switch elements and a load, and at least one capacitor connected between the load and any of said voltages,
    a drive circuit for controlling each switch element in order to switch off the corresponding switch element when a reference current has been obtained in the inductor and for switching on the corresponding switch element when the current in the inductor is essentially zero,
    a first timer circuit adapted to prevent the on-switch of one of the switch elements until a minimum time period has passed such that the maximum switching frequency of the bridge circuit is limited, wherein the first timer circuit is adapted to prevent the on-switch of said one of the switch elements until the minimum time period has passed from the previous on-switch of said one of the switch elements, and
    a second timer circuit for switching on the respective switch elements after a time-out period.

8. The circuit according to claim 7, wherein said reference current is adjustable in dependence of the minimum time period.

9. The circuit according to claim 7, wherein said time-out period is adjustable and is always longer than said minimum time period.

10. An inverter for driving a load at varying power and varying frequencies, comprising:
    an upper and a lower switch element, connected to a positive and a negative voltage, respectively, and comprising a flywheel diode connected in parallel with each switch element,
    an inductor connected between a junction of the switch elements and a load, and at least one capacitor connected between the load and any of said voltages,
    a drive circuit for controlling each switch element in order to switch off the corresponding switch element when a reference current has been obtained in the inductor and for switching on the corresponding switch element when the current in the inductor is essentially zero,
    a first timer circuit adapted to prevent the on-switch of one of the switch elements until a minimum time period has passed such that the maximum switching frequency of the bridge circuit is limited, wherein the first timer circuit is adapted to prevent the on-switch of said one of the switch elements until the minimum time period has passed from the previous on-switch of said one of the switch elements,
    a current comparator for comparing an inductor current with the reference current and for switching off said one of the switch elements when the inductor current exceeds the reference current, and
    a voltage comparator for switching on said one of the switch elements when the junction voltage exceeds a preset voltage.

11. The inverter according to claim 10, further comprising a second timer circuit for switching on the respective switch element after a time-out period.

12. The inverter according to claim 11, wherein said reference current is adjustable in dependence of the minimum time period.

13. The inverter according to claim 11, wherein said time-out period is adjustable and is always longer than said minimum time period.

14. The inverter according to claim 10, further comprising a clamping circuit for preventing fast oscillations of the voltage comparator after a positive transition of the voltage comparator.

15. The inverter according to claim 14, wherein the clamping circuit comprises a third timer blocking negative transitions of the voltage comparator during a predetermined time period, such as 15 μs.

16. The inverter according to claim 10, wherein at least one additional control circuit is arranged for the upper and the lower switch elements and wherein said switch element is a transistor of the MOSFET type having an inherent flywheel diode or a transistor of the IGBT type having a flywheel diode connected in parallel therewith.

17. The inverter according to claim 10, wherein said minimum time period is adjustable.

* * * * *